United States Patent [19]

Grabbe et al.

[11] Patent Number: 4,880,386
[45] Date of Patent: Nov. 14, 1989

[54] SOCKETING A SEMICONDUCTOR DEVICE

[75] Inventors: Dimitry G. Grabbe, Middletown; Iosif Korsunsky, Harrisburg, both of Pa.

[73] Assignee: AMP Incorporated, Harrisburg, Pa.

[21] Appl. No.: 273,398

[22] Filed: Nov. 18, 1988

[51] Int. Cl.⁴ .................... H01R 9/09; H01R 23/72
[52] U.S. Cl. ..................................... 439/68; 206/328; 439/526
[58] Field of Search .................................. 439/68–70, 439/525, 526; 174/52.4; 357/69, 70; 206/328, 334

[56] References Cited

U.S. PATENT DOCUMENTS

| Re. 30,604 | 5/1981 | Kowalski | 357/70 |
|---|---|---|---|
| 4,007,479 | 2/1977 | Kowalski | 357/70 |
| 4,513,353 | 4/1985 | Bakermans et al. | 361/399 |
| 4,684,184 | 8/1987 | Grabbe et al. | 439/64 |
| 4,696,526 | 9/1987 | Newton et al. | 439/68 |
| 4,699,593 | 10/1987 | Grabbe et al. | 439/71 |
| 4,744,009 | 5/1988 | Grabbe et al. | 361/398 |

OTHER PUBLICATIONS

AMP Drawing Sheet Entitled "Ass'y Socket, High Speed".

Primary Examiner—Neil Abrams
Attorney, Agent, or Firm—James M. Trygg

[57] ABSTRACT

A film mounted semiconductor device is applied to a socket therefor by means of a protective carrier from which project four posts arranged in such a way that a line drawn between two opposite posts would pass through the center of the carrier. The film is formed with elongate slots each receiving one of the posts with clearance in the longitudinal direction of the slot but the post closely fitting the slot in its transverse direction. Each post is fitted snugly into a pocket in the socket. The slots allow relative movement between the film and the posts to take up dimensional changes resulting from temperature and humidity changes, but as the posts fit the slots in their transverse direction, the film, the carrier and the socket are maintained concentric.

18 Claims, 5 Drawing Sheets

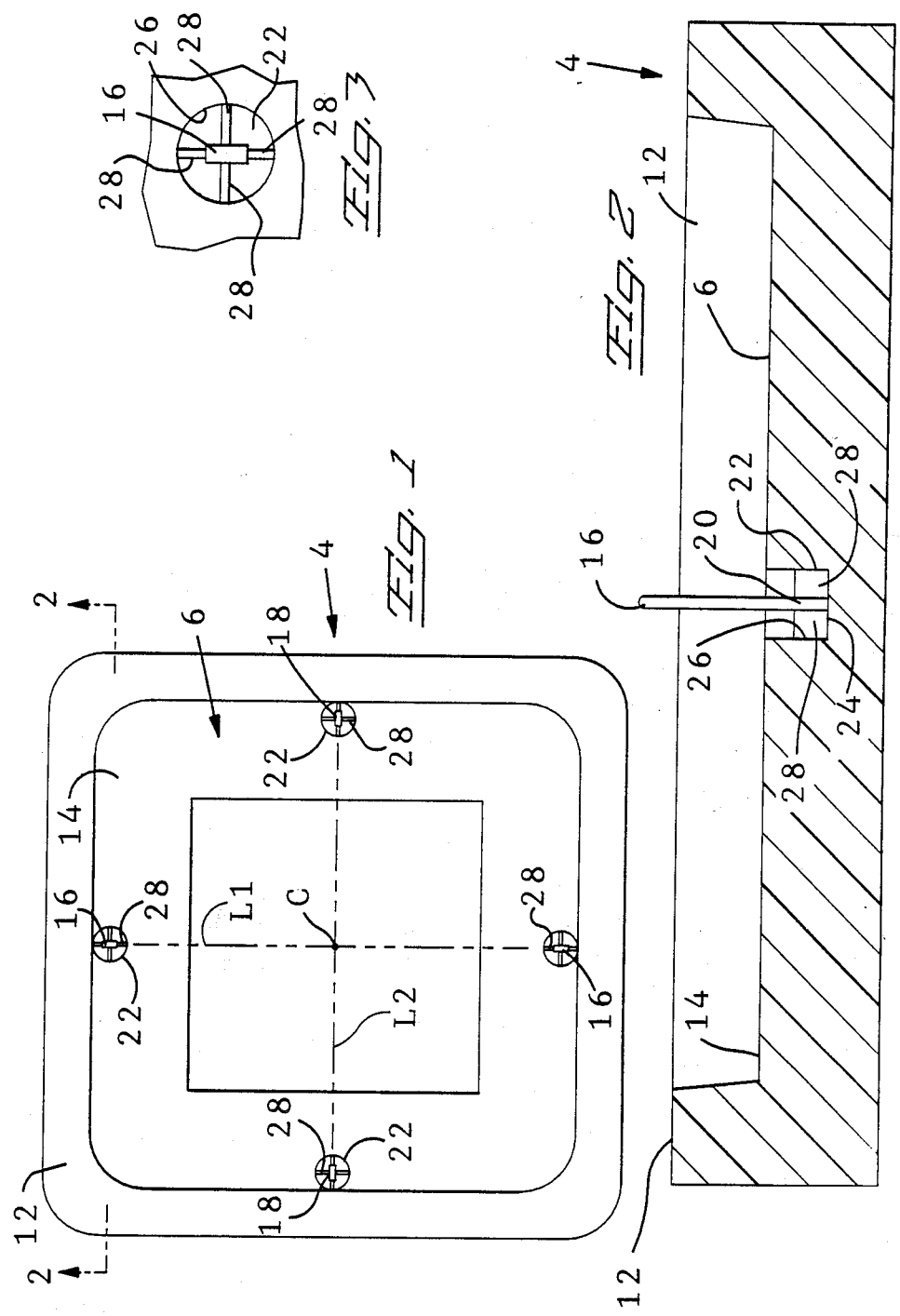

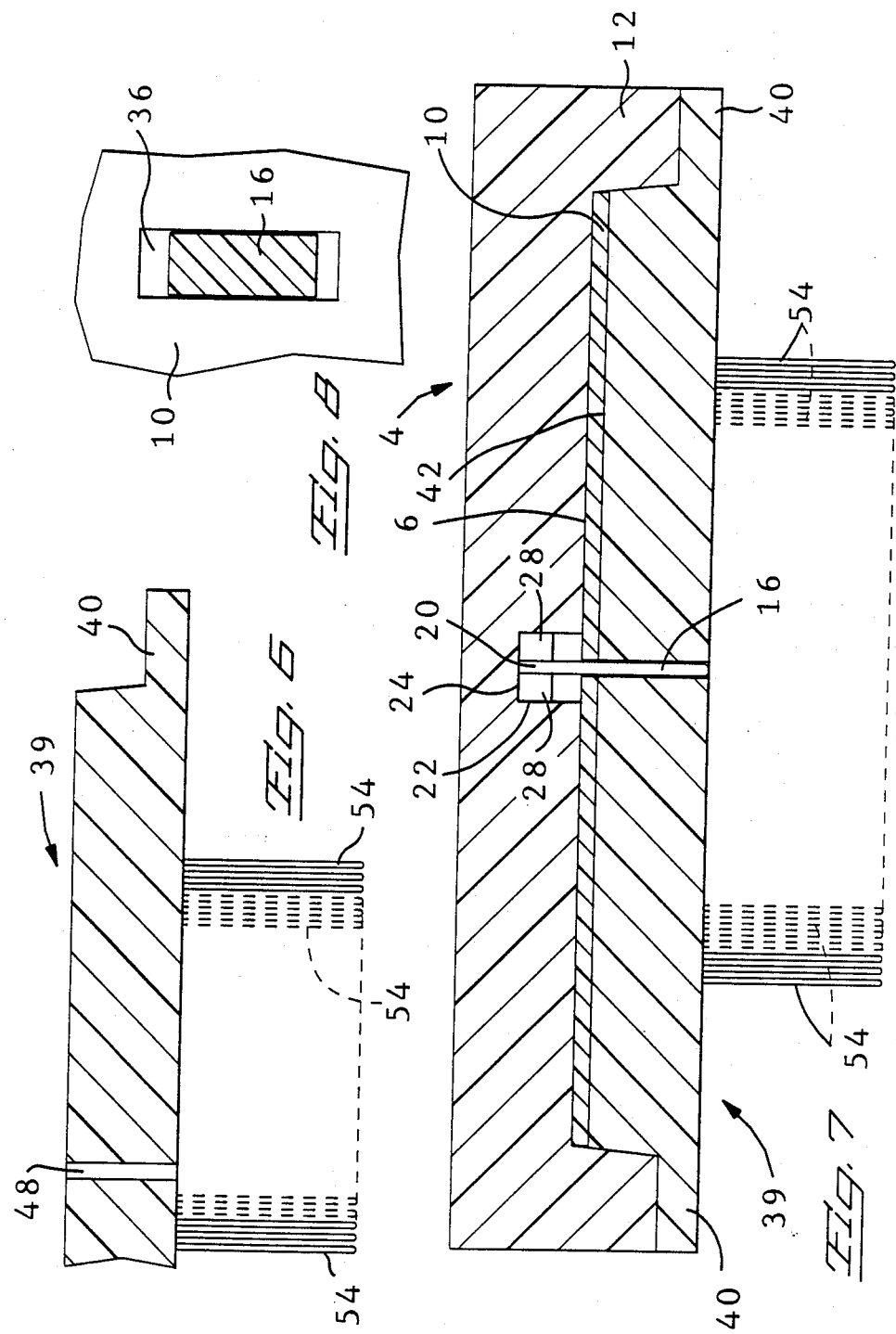

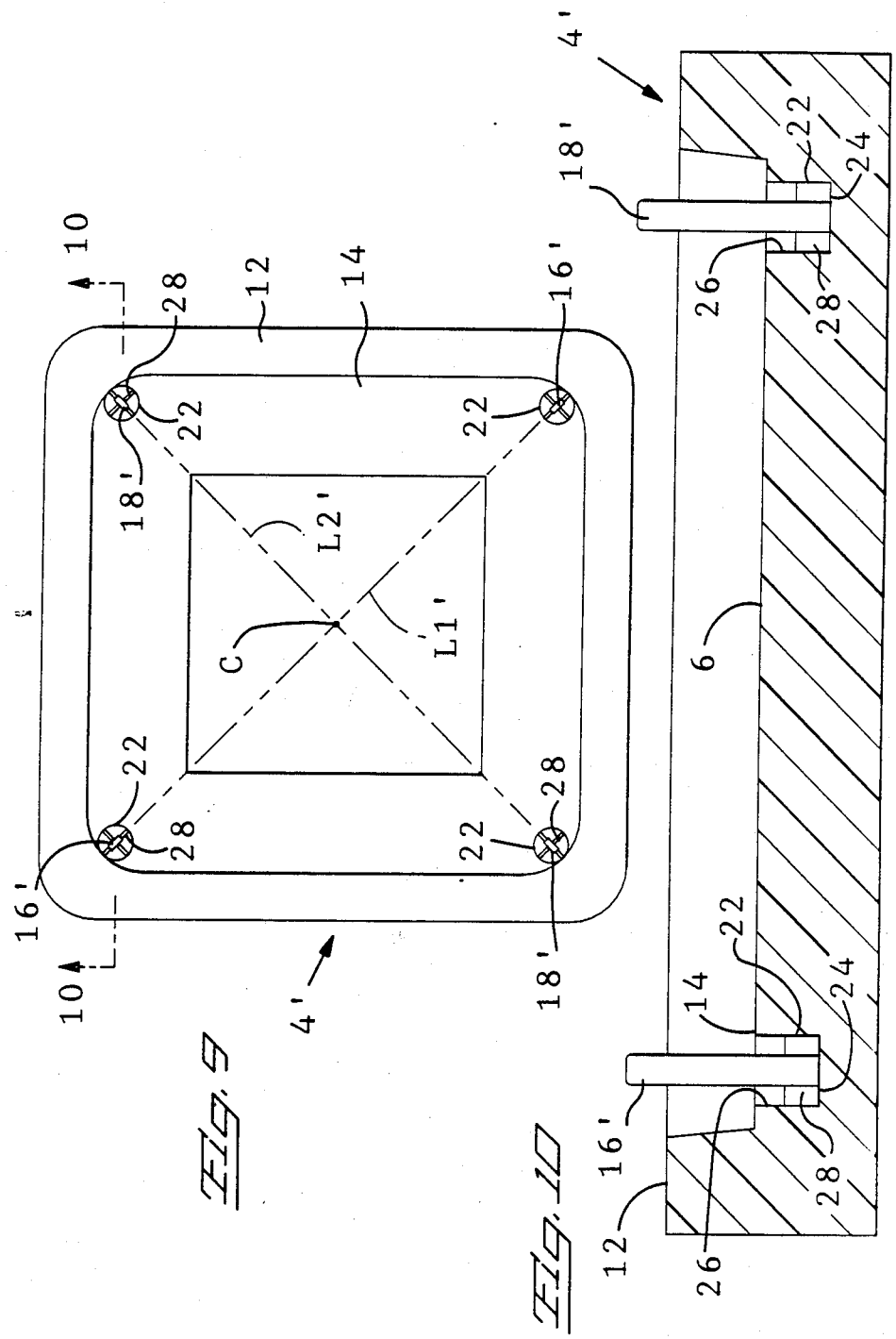

SOCKETING A SEMICONDUCTOR DEVICE

FIELD OF THE INVENTION

This invention relates to the mounting of a semiconductor device of the tape automated bonded (TAB) type, to a socket for connection to external circuitry, the semiconductor device being bonded, in manufacture, to leads attached to a segment of film. The term "semiconductor device" as used herein, means any semiconductor apparatus or device including discreet circuit components or integrated circuits, especially those of higher density.

BACKGROUND OF THE INVENTION

A problem that occurs in socketing semiconductor devices which are made on film, is that since the film is dimensionally unstable, it expands and contracts not only as a result of temperature changes, but also with changes in ambient humidity, whereby mismatch occurs because the film and the socket are made from different materials having different thermal and moisture problems and properties. The invention concerns the minimization of such mismatch in order to optimize mating registration between the film and the socket.

There is disclosed in U.S. Pat. No. 4,007,479 a fixture for a segment of film strip, in which the film is located between pins or posts projecting from one part of the fixture and which engage in openings in the other part. There is also disclosed in U.S. Pat. No. 4,696,526, a two part carrier for a film mounted semiconductor, in which square posts on one part are sized to fit sprocket holes in the film in order to align it with the carrier. U.S. Pat. No. Re. 30,604 discloses a re-usable fixture for a film mounted semiconductor device having lugs which are positioned to project through sprocket holes in the film and are located so that wedge shaped protrusions of the lugs overlie the film. The film carrying means described in the three patent specifications mentioned above, are intended for holding the film in position, only temporarily, while certain manufacturing steps are carried out thereupon so that the problem of socketing, for permanent use, a film mounted semiconductor device, and in particular the problems outlined above, with which the present invention is concerned, are accordingly not addressed in these specifications.

SUMMARY OF THE INVENTION

The Invention proceeds from the realization, that when supported between the protective carrier and the socket, there should be free relative movement between the film, and the carrier and socket to allow for the difference in materials mentioned above in the face of temperature and ambient humidity changes.

According to one aspect of the present invention, an electrical connector assembly comprises, in combination, a semiconductor device bonded to leads attached to a segment of film, a protective carrier for the film, and an insulating socket mating with the protective carrier and having electrical contact elements for connecting the semiconductor device to an external circuit and for engaging contact pads on the leads of the semiconductor device. A peripheral margin of the film segment is formed with a plurality of pairs of slots, each of which is elongate in the direction of a center point of the film, within said margin, the slots of each pair being located on diametrically opposite sides of the center point. The protective carrier provides a first seat for the film segment and from which seat upstand a plurality of posts each engaged in a respective one of the elongate slots in the margin of the film segment, with substantial clearance in the longitudinal direction of the slot, but fitting the slot in the transverse direction thereof. The socket provides a second seat for the film segment, there being formed in the second seat, a plurality of pockets each snugly receiving a respective on of the posts on the protective carrier. When putting the assembly together, the film is first placed over the posts of the protective carrier so that each post extends through one of the slots in the film segment. The carrier is then transported to its site of use and the posts are inserted into the pockets of the insulating socket so that the film segment lies between the seat of the protective carrier and that of the socket. As there is substantial clearance in the longitudinal direction between each post and the slot through which it has been passed, relative movement between the film segment and the other components of the assembly will be taken up as temperature or humidity changes occur, so that the film segment which is very thin, typically having a thickness of about 0.003 inches or so and, therefore, having very little mechanical strength, is undamaged as a result of said movement.

The slots in the film segment, the posts on the protective carrier, the pockets in the insulating socket are four in number, according to a preferred embodiment of the invention, each slot of one pair slots being angularly spaced by 90° about the center point of the film segment from each of the slots of the other pair. The film segment will normally be substantially square and the slots may be located proximate to the corners of the square or each may be located centrally of one side thereof. Since each post fits its slot in the transverse direction thereof, the center lines of the carrier, the film and the socket are maintained concentric when these parts have been assembled.

In order to enhance the mating accuracy of the carrier, the film segment and the socket, the posts are preferably very thin, having a major dimension, of the order, for example, of 0.040 inches. The posts would in the absence of counter-measures, accordingly tend to break at their roots when the assembly is being put together. In order to avoid this disadvantage, the root of each post is positioned in a well extending below the surface of the protective carrier and supporting ribs connected to the posts and to the peripheral wall of the well are provided, so that the posts will not break at their roots. The well may be circular and the ribs may extend radially thereof, being formed integrally as with the posts and insulating material of the carrier.

According to another aspect of the invention, a protective carrier for a semiconductor device bonded to leads attached to a segment of film, is in the form of a plate defining a planar seat for the film segment, the seat having a peripheral margin and a center point within the margin. Two pairs of posts upstand from the margin, normally of the seat, each post being of elongate cross section in the direction of the center point of the seat. The posts of each pair are located on diametrically opposite sides of the center point, each post having a base portion which extends into a well in said margin, the well having a peripheral wall and the root of the post being supported therein by means of opposed ribs which connect the root of the post to the peripheral wall of the well.

According to yet a further aspect of the invention, a method of socketing a semiconductor device bonded to leads attached to a segment of film having a peripheral margin and a center point within the margin, comprises the steps of; forming in said peripheral margin a plurality of pairs of slots each of which is elongate in the direction of said enter point, the slots of each pair being located on diametrically opposite sides of the center point; threading through each slot, a post upstanding from a protective carrier for the film segment, with play only in the longitudinal direction of the slot; and inserting each post snugly into a respective pocket of a semiconductor device socket so that the film is enclosed between the carrier and the socket.

BRIEF DESCRIPTION OF THE DRAWINGS

FIG. 1 is a plan view of a protective carrier for a film mounted semiconductor device;

FIG. 2 is an enlarged sectional view taken on the lines 2—2 of FIG. 1;

FIG. 3 is an enlarged, fragmentary plan view illustrating a detail of FIG. 1;

FIG. 6 is a fragmentary cross sectional view through the socket of FIG. 5;

FIG. 7 is a cross sectional view illustrating an electrical connector assembly comprising, in combination, the protective carrier of FIGS. 1–3, the film mounted semiconductor device of FIG. 4, and the socket of FIGS. 5 and 6;

FIG. 8 is an enlarged, fragmentary plan view shown partly in section, illustrating a detail of FIG. 7;

FIG. 9 is a plan view of a modified form of the protective carrier;

FIG. 10 is a cross sectional view taken on the lines 10—10 of FIG. 9;

DETAILED DESCRIPTION OF THE INVENTION

Figure 4:
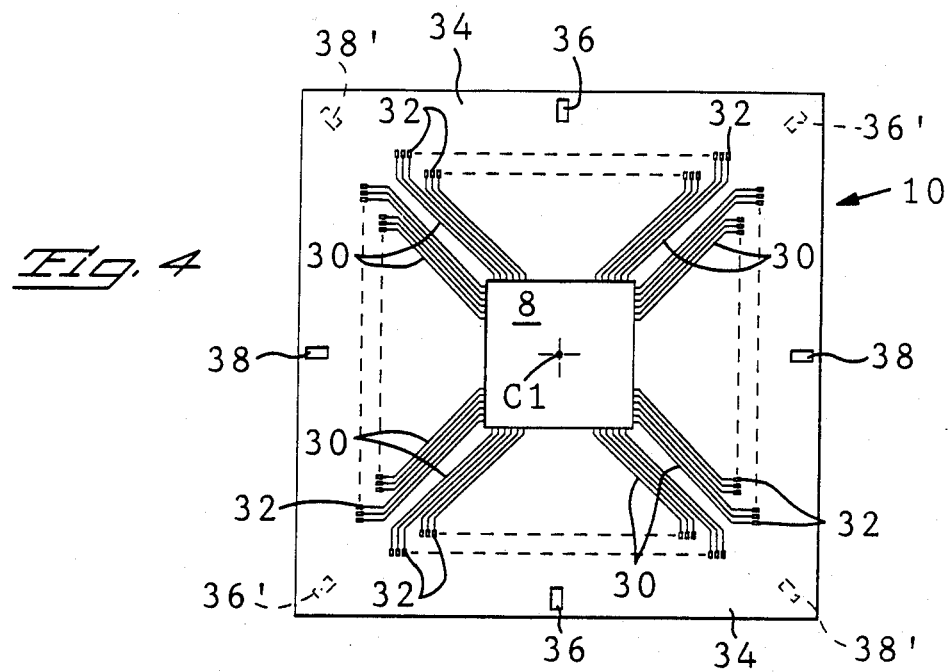
FIG. 4 is a plan view of a semiconductor device mounted on a segment film.

As shown in FIGS. 1 and 2, a protective carrier 4 molded in one piece from insulating material, is substantially square as seen in plan view, being in the form of a plate defining a seat 6, which is planar, for a semiconductor device 8 (FIG. 4) mounted on a segment 10 of film and which is described in more detail below. The seat 6, which is substantially rectangular, is surrounded by a rim 12 and has a center point C within a peripheral margin 14 of the seat 6. There upstand from the margin 14, normally of the seat 6, two pairs of posts, the posts of the two pairs being referenced 16 and 18, respectively. All four posts are identical, although the posts 16 are differently orientated from posts 18, as described below. As best seen in FIGS. 2 and 3 with reference to one of the posts 16, each post extends from the base 6 to a position beyond the rim 12 and has a root 20 located in a well 22 extending into the material of the carrier 4 below the surface of the margin 14 of the seat 6. The root 20 is formed integrally with the base 24 of the well 22 and is positioned centrally of the circular peripheral wall 26 of well 22. Also formed integrally with the base 24 and with the wall 26 are supporting ribs 28. Each post 16 and 18 is of constant elongate rectangular cross section, each rib 28 adjoining a respective side of the root 20 of the post. As shown in FIG. 1, the posts of each pair 16 and 18, are located on diametrically opposite sides of the center point C of the seat 6. Each of the posts is, as seen in cross section, elongate in the direction of the center point C of the seat 6, each post of one pair 16 or 18 being angularly spaced by 90° about the center point 6 from each of the posts of the other pair 16 or 18. It will be apparent from FIG. 1, that the posts are arranged in such a way that a line L1 or L2 drawn between a pair of opposite posts of a pair 16 or 18 passes through the center point C. In the protective carrier of FIGS. 1 to 3, each post is located exactly centrally of side of substantially rectangular seat 6.

As shown in FIG. 4, the semiconductor device 8 is bonded to leads 30, only some of which are shown, attached to the film segment 10 and being electrically connected to contact pads 32 distributed about a center point C1 of the film segment 10, which is substantially square. There are formed in a peripheral margin 34 of the film segment 20, two pairs 36 and 38, of slots, each of these slots being elongate in the direction of the center point C1 and the slots of each pair 36 and 38 being located on diametrically opposite sides of the point C1 and each slot of one pair 36 or 38 being angularly spaced by 90° about the point C1 from each of the slots 36 or 38 or the other pair. Each slot in the film segment 10 is arranged substantially centrally of a respective one of the sides of the peripheral margin 34. Thus the slots are so arranged that each can receive a respective one of the posts of the carrier 4. As best seen in FIG. 8, which shows a post 16 and a slot 36, each of the posts is, as seen in cross section, shorter than the length of the corresponding slot so that it is received with play therein in the longitudinal direction. However, as will be apparent from FIG. 8, the post closely fits the slot in the transverse direction thereof, that is to say it is a "line fit" across the slot.

Figure 5:
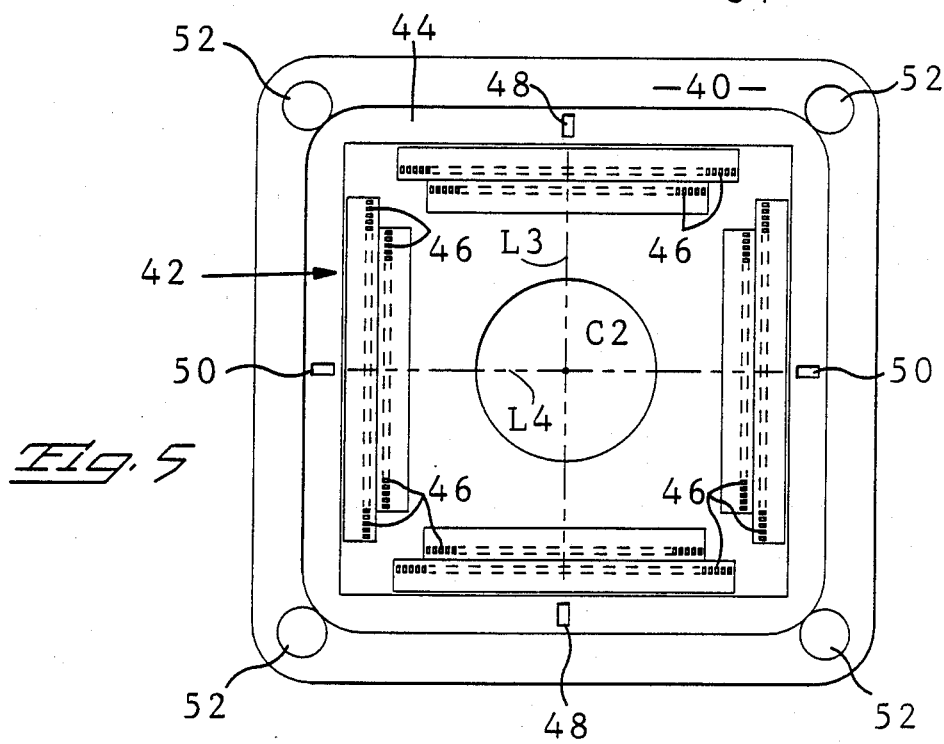
FIG. 5 is a plan view of an electrical socket for the film mounted semiconductor device.
Figure 11:
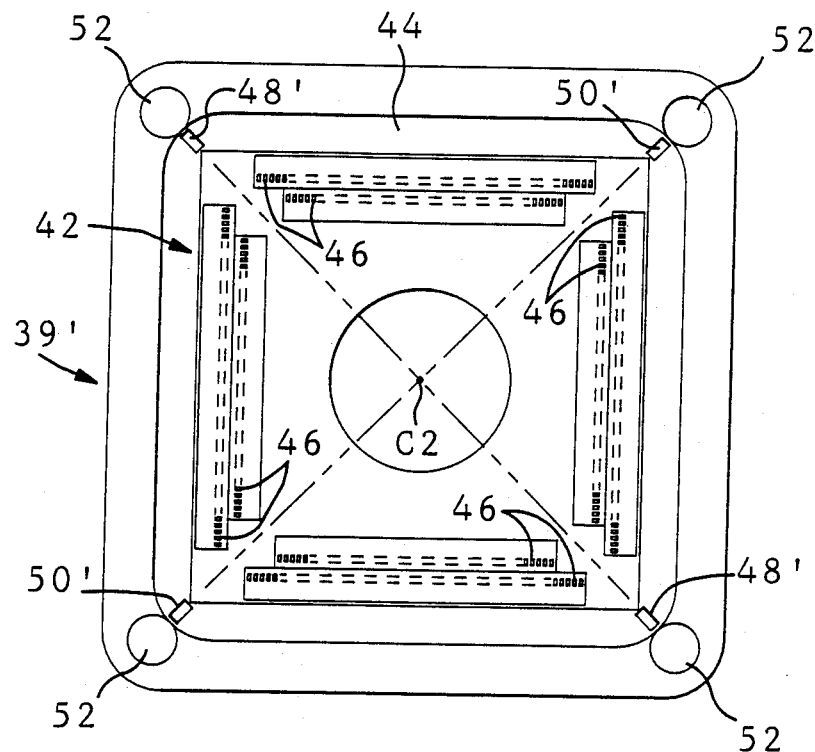
FIG. 11 is a plan view illustrating a modified form of the socket.
Figure 12:
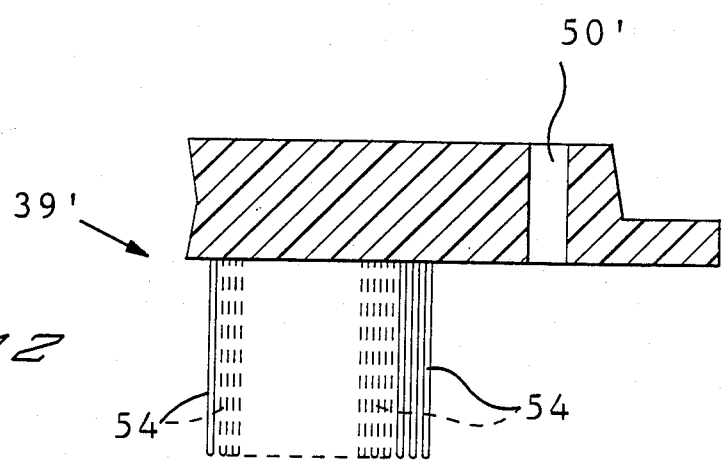
FIG. 12 is a fragmentary cross sectional view through the socket of FIG. 11.

As shown in FIGS. 5 and 6, and insulating carrier 39 for the semiconductor device 8 on its film segment 10, is substantially square as seen in plan view, having a peripheral flange 40 extending about a seat, generally referenced 42, for the film segment 10, the seat 42 having a planar periphery 44. Within the periphery 44, sets of electrical contact elements 46 are symmetrically distributed about the center point C2 of the seat 42, each for electrical conductive engagement with a respective one of the contact pads 32 on the film segment 10 when it is on the seat 42. There are formed in the margin 44, two opposed pairs of rectangular elongated cross section pockets 48 and 50, respectively, each pocket being elongate in the direction of the center point C2 and the pockets of each pair being located on diametrically opposite sides of the point C2, each pocket of one pair being angularly spaced by 90° about the point C2 from each of the pockets of the other pair, in such a way that a line drawn L3 or L4 between each pair of opposite pockets passes through the center point C3. The pockets are accordingly located to receive the respective posts of the carrier 4. Each pocket 48 is dimensioned to receive its respective post with a snug fit in the transverse direction.

The flange 40 is formed with openings 52 to receive fasteners (not shown) for securing it to a substrate, for example, a printed circuit board, not shown. Each contact element 46 has a tail 54 depending from the socket 39, for connection to electrical circuitry on the substrate or, if the socket is to be surface mounted, a contact (not shown) for engagement with a conductor pad on the surface of the substrate. The contact elements, may for example be constructed according to the teaching of U.S. Pat. Nos. 4,354,729, or 4,513,353, both of which are incorporated herein by reference.

In order to connect the semiconductor device 8 to the substrate circuitry, the film segment 10 is first assembled to the carrier 4 by passing the posts 16 and 18 thereof through respective slots 36 and 38 of the film segment 10 so that the latter lies on the seat 6 of the carrier 4. The posts 16 are then inserted into respective pockets 48 of the socket 39 and the posts 18 are inserted into respective pockets 50 of the socket 39 and the posts 18 are inserted into respective pockets 50 of the socket 39 until film 10 lies on the seat 42 of the socket 39, as shown in FIG. 7. The carrier 4 and the socket 39 are then in mating relationship with respective contact pads on the film 10 and in electrically conductive contact with respective contact elements 46 of the socket 39. As will best be apparent from FIG. 8, the longitudinal play allowed for by the relative dimensions of the posts and the slots, permits relative movement between the film 10 and the posts 16 and 18 under the action of humidity and temperature changes to which the electrical connector assembly comprising the carrier 4, the film segment 10 and the socket 39 will be subjected when in use. However, the said "line fit" between the posts and the longitudinal edges of the slots ensures that the parts of the assembly are always concentric. By virtue of the supporting ribs 28 the posts will not break off their roots 20 during the assembly of the carrier 4 to the socket.

As shown in FIGS. 9 through 12, in which parts referred to above with reference to FIGS. 1 through 11, bear the same reference numerals, the posts of the protective carrier 4' are arranged at the corners of the margin 14' and are referenced 16' and 18' of each pair are diametrically opposite to one another on either side of the center point C and are elongate theretowards as seen in plan view or in cross section, being arranged so that lines L1' and 2' drawn between the opposite posts of the post pairs 16' and 18' respectively, intersect the center point C. The posts of one pair 16' or 18' are angularly spaced by 90° about the center point C from each of the posts of the other pair 16' or 18'. As indicated in broken lines in FIG. 4 elongate slots 36' and 38' are formed in a film segment to be used with the carrier of FIGS. 9 and 10, these slots being arranged to receive respective posts 16' and 18' therefore being arranged at the corners of the margin 34 of the film segment. They are positioned with respect to the center point C1 thereof in the same way as the posts of the pairs 16' and 18' are positioned relative to the center point C of the carrier 4'. The slots of the pairs 36' and 38' are dimensioned relative to the posts of the pairs 17' and 18' in the same way as the posts 16' and 18' of the carrier, are dimensioned relative to the slots of the pairs 36' and 38' in the film segment. Similarly, the socket 39' is provided with pairs of opposed pockets 48' and 50' arranged at the corners of the periphery 44' of the socket 39' so as to be located for receiving the respective posts of the pairs 16' and 18', the pockets of the pairs 48' and 50' being dimensioned snugly to receive their posts. It will be apparent, therefore, that the connector assembly produced from the parts just described, is analogous both in construction and operation to that of the connector assembly produced from the parts described above the reference to FIGS. 1 through 8.

We claim:
1. An electrical connector assembly comprising in combination;
   a semiconductor device bonded to leads attached to a segment of film having a peripheral margin and a center point within the margin, the leads being electrically connected to contact pads distributed about said center point, said margin having formed therein a plurality of pairs of slots, each of which is elongate in the direction of said center point, the slots of each pair being located on substantially diametrically opposite sides of said center point;
   a protective insulating carrier providing a first seat for said film segment and from which upstands a plurality of posts each engaged in a respective one of said elongate slots each with substantial clearance in the longitudinal direction thereof but closely fitting the slot in the transverse direction thereof; and
   an insulating socket mated with said carrier and providing a second seat for said film segment, there being formed in said second seat, a plurllity of pockets each snugly receiving a respective one of said posts, a plurality of electrical contact elements provided on said second seat, each engaging a respective one of said contact pads on said film, for connecting the semiconductor device to an external circuit.

2. An assembly as claimed in claim 1, wherein said slots, said posts and said pockets are each four in number, each slot of one pair being angularly spaced by 90° about said center point from each of the slots of the other pair.

3. An assembly as claimed in claim 2, wherein said film segment and said seats are substantially square, said slots, said posts and said pockets being located proximate to respective corners thereof.

4. An assembly as claimed in claim 2, wherein said film segment and said seats are substantially square, said slots, said posts and pockets being located centrally of respective sides thereof.

5. An assembly as claimed in claim 1, wherein said slots, said posts and said pockets are located in peripheral margins of said film segments and of said first and second seats respectively.

6. An assembly as claimed in claim 1, wherein each post is of substantially rectangular cross section, being elongate in the direct of said center point.

7. An assembly as claimed in claim 1, wherein each post extends, with clearance, into a well opening into said first seat, and is supported therein by ribs formed integrally with said posts and with a peripheral wall of said well.

8. An assembly as claimed in claim 7, wherein said well is circular cross section, said ribs extending radially thereof and being four in number.

9. An assembly as claimed in claim 7, wherein each post is of substantially rectangular elongate cross section, said well being defined by a circular wall, each rib connecting one side of the post to said circular wall.

10. An assembly as claimed in claim 1, wherein the protective carrier is in the form of an insulating plate having a substantially square central depression with a planar floor defining the seat, the posts upstanding form a peripheral margin of the seat.

11. A protective carrier for a semiconductor device bonded to leads attached to a segment of film, the protective carrier being in the form of a plate defining a planar seat for said film segment, the seat having a peripheral margin and a center point within said margin, there upstanding from said margin, normally of the seat, two pairs of posts which are of elongate cross section in the direction of said center point, the posts of each pair being located on diametrically opposite sides of the center point of the seat, each post having a root which extends into a well in said margin, said well having a peripheral wall and said root being supported in the well by means of opposed ribs which connect said root to said peripheral wall.

12. A protective carrier as claimed in claim 11, wherein said peripheral wall extends about a floor of the recess, the root of the post being formed integrally with the floor and said ribs.

13. A protective carrier as claimed in claim 12, wherein said peripheral wall is circular and said ribs extend radially thereof, each rib being connected to a respective side wall of the root of the post.

14. A protective carrier as claimed in claim 11, wherein said posts are four in number, each post of one pair being angularly spaced by 90° about said center point from each of the posts of the other pair.

15. A protective carrier as claimed in claim 14, wherein said seat is substantially square, each post being located proximate to a corner of the seat.

16. A protective carrier as claimed in claim 14, wherein said seat is substantially square and each post is substantially equidistant from two opposite corners of the seat.

17. A protective carrier according to claim 11, wherein said seat is defined by a base of a recess in said plate, said posts projecting from said recess.

18. A method of socketing a semiconductor device bonded to leads attached to a segment of film having a peripheral margin and a center point within said margin, the method comprising the steps of;
(a) forming in said peripheral margin, a plurality of pairs of slots each of which is elongate in the direction of said center point, the slots of each pair being located on diametrically opposite sides of said center point;
(b) threading through each slot, a post upstanding from a protective carrier for the film segment, with play only in the longitudinal direction of the slot; and
(c) inserting each post snugly into a respective pocket in a socket for the semiconductor device, so that film segment is enclosed between the carrier and the socket.

* * * * *